(12) United States Patent
Doi

(10) Patent No.: US 8,872,574 B2
(45) Date of Patent: Oct. 28, 2014

(54) INTERPOLATION CIRCUIT AND RECEPTION SYSTEM

(71) Applicant: Fujitsu Limited, Kawasaki (JP)

(72) Inventor: Yoshiyasu Doi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 13/755,900

(22) Filed: Jan. 31, 2013

(65) Prior Publication Data

US 2013/0285706 A1 Oct. 31, 2013

(30) Foreign Application Priority Data

Apr. 25, 2012 (JP) ................................. 2012-100390

(51) Int. Cl.
*G06F 7/64* (2006.01)
*G06G 7/18* (2006.01)
*G06G 7/19* (2006.01)

(52) U.S. Cl.
USPC ........................................... 327/337; 327/91

(58) Field of Classification Search
USPC ................. 327/337, 91, 94–97; 341/122–125
See application file for complete search history.

(56) References Cited

U.S. PATENT DOCUMENTS

| | | | | |
|---|---|---|---|---|
| 5,159,341 A * | 10/1992 | McCartney et al. | .......... | 341/143 |
| 5,281,680 A * | 1/1994 | Grot | .............................. | 526/243 |
| 5,966,047 A * | 10/1999 | Anderson et al. | ............. | 327/565 |
| 7,157,976 B2 * | 1/2007 | Chang | ........................... | 330/308 |
| 7,671,776 B1 * | 3/2010 | Rangan et al. | ................. | 341/150 |
| 7,679,422 B1 * | 3/2010 | Thiagarajan et al. | .......... | 327/337 |
| 8,368,430 B2 * | 2/2013 | Watanabe | ....................... | 327/96 |
| 2004/0113830 A1 | 6/2004 | Yoshioka et al. | | |
| 2010/0283643 A1 * | 11/2010 | Byrne et al. | ................... | 341/122 |
| 2011/0001518 A1 * | 1/2011 | Debnath et al. | ................. | 327/96 |

FOREIGN PATENT DOCUMENTS

| | | |
|---|---|---|
| JP | 03-247023 A | 11/1991 |
| JP | 2011-205366 A | 10/2011 |
| WO | WO 02/052775 A1 | 7/2002 |

\* cited by examiner

*Primary Examiner* — Quan Tra
(74) *Attorney, Agent, or Firm* — Arent Fox LLP

(57) ABSTRACT

An interpolation circuit includes: a first node to receive a first current; a second node to receive a second current; a third node to receive a third current; a first capacitor circuit including: first capacitors; a first switch to couple one end of each of first capacitors to one of first and second nodes; and a first output coupled to the other end of each of first capacitors; a second capacitor circuit including: second capacitors; a second switch to couple one end of each of second capacitors to one of second and third nodes; and a second output node coupled to the other end of each of second capacitors; and a third capacitor circuit including: a third capacitor whose one end is coupled to the second node; and a third switch to couple the other end of the third capacitor to one of first and second output nodes.

20 Claims, 13 Drawing Sheets

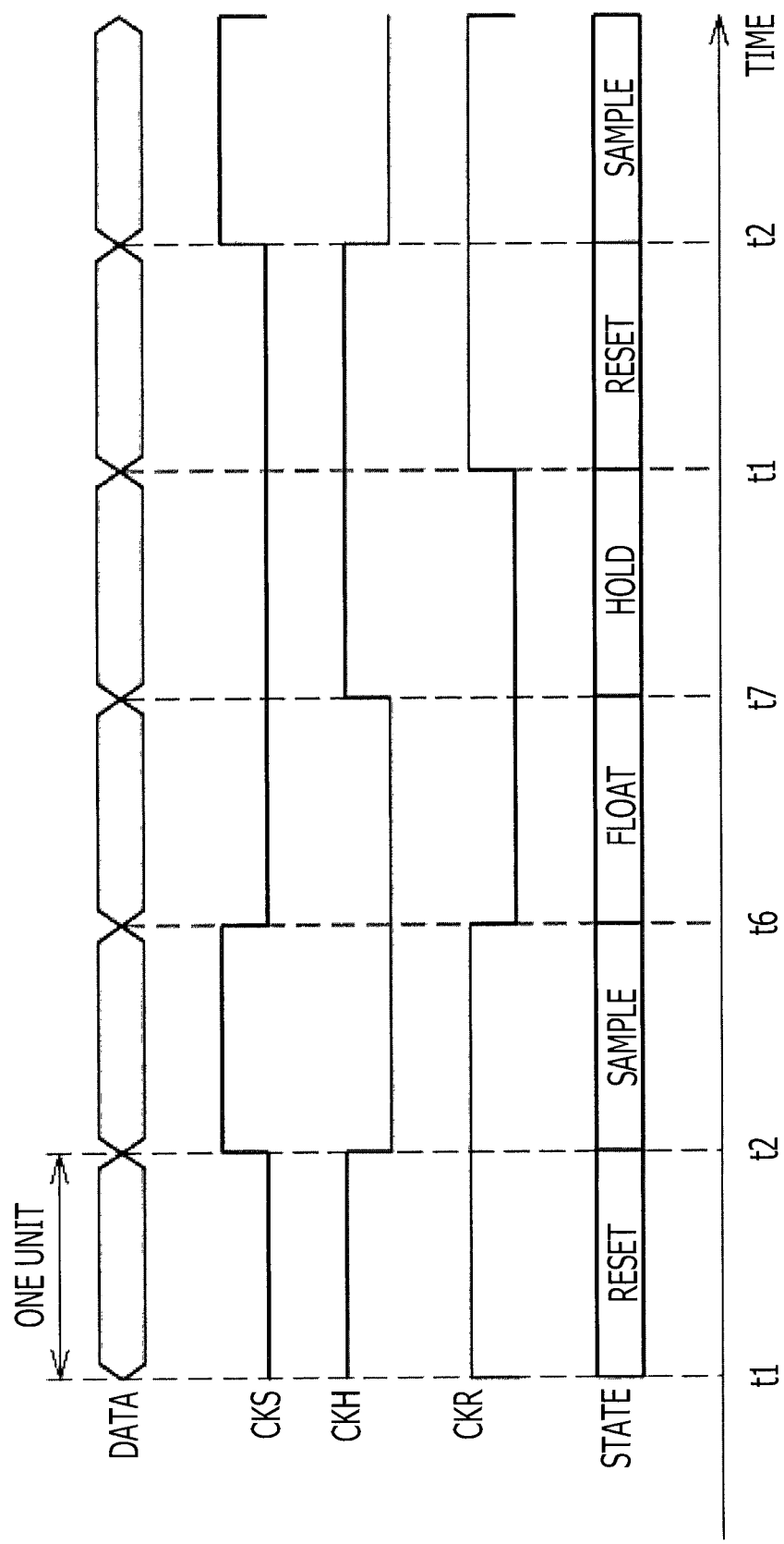

:

INTERPOLATION CIRCUIT AND RECEPTION SYSTEM

CROSS-REFERENCE TO RELATED APPLICATION(S)

This application is based upon and claims the benefit of priority of the prior Japanese Patent Application No. 2012-100390, filed on Apr. 25, 2012, the entire contents of which are incorporated herein by reference.

FIELD

The embodiments discussed herein are related to an interpolation circuit and a reception system.

BACKGROUND

The data rate of the transmission/reception of signals inside and outside a device intended for a communication backbone or an information processing device such a server becomes high. Reception circuits in transmitter-receivers include a synchronous-type where sampling is performed in synchronization with the phase of input data and an asynchronous-type where sampling is performed out of synchronization with the phase of input data. In an asynchronous-type reception circuit, reception data is generated based on sampled data using interpolation.

A related art is disclosed in Japanese Laid-open Patent Publication No. 3-247023.

SUMMARY

According to one aspect of the embodiments, an interpolation circuit includes: a first node configured to receive a first current corresponding to input data; a second node configured to receive a second current corresponding to the input data; a third node configured to receive a third current corresponding to the input data; a first capacitor circuit, the first capacitor circuit including: a plurality of first capacitors; a first switch configured to coupe one end of each of the plurality of first capacitors to one of the first node and the second node; and a first output coupled to the other end of each of the plurality of first capacitors; a second capacitor circuit, the second capacitor circuit including: a plurality of second capacitors; a second switch configured to couple one end of each of the plurality of second capacitors to one of the second node and the third node; and a second output node coupled to the other end of each of the plurality of second capacitors; and a third capacitor circuit, the third capacitor circuit including: a third capacitor whose one end is coupled to the second node; and a third switch configured to couple the other end of the third capacitor to one of the first output node and the second output node.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an exemplary operation of a sampling circuit.

DESCRIPTION OF EMBODIMENTS

In an asynchronous-type reception circuit, a switched capacitor whose circuit size is large may be used as an interpolation circuit for generating reception data from input data.

Figure 1A:
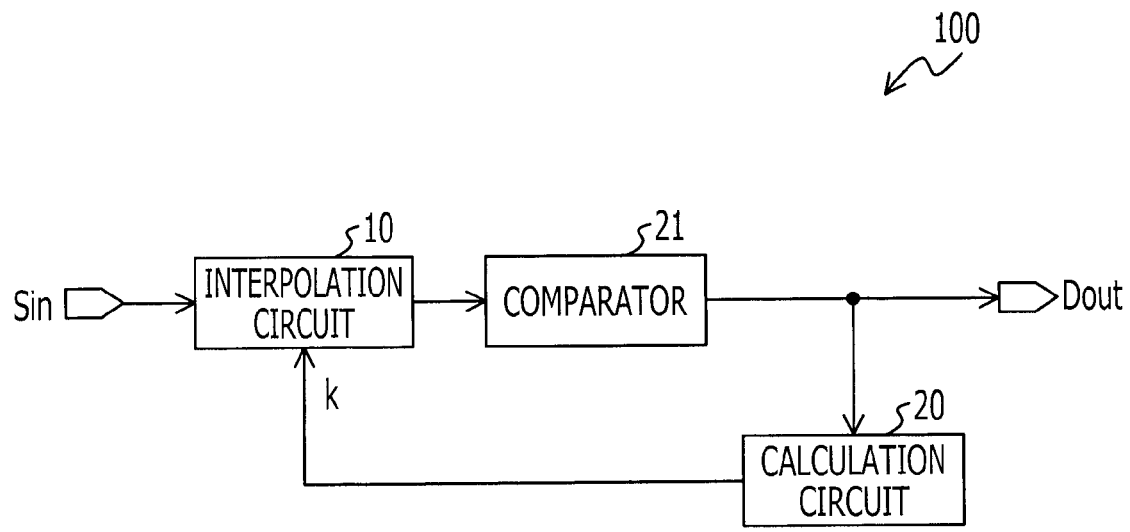
FIG. 1A illustrates an exemplary reception circuit.
Figure 1B:
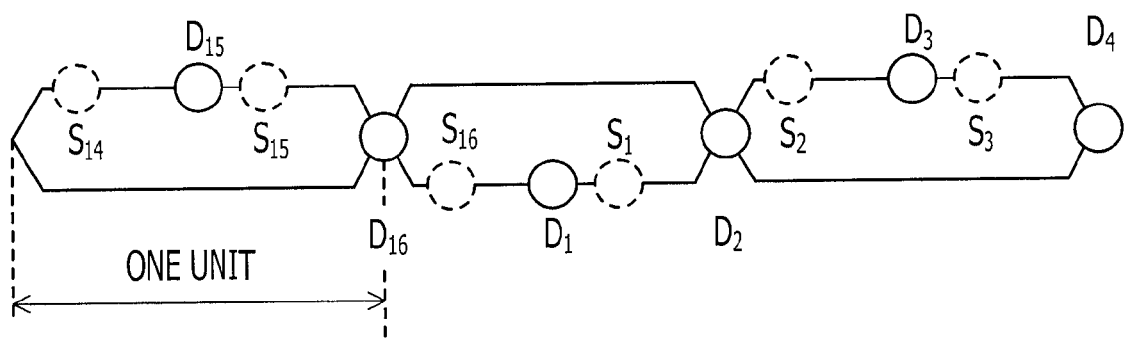
FIG. 1B illustrates an exemplary sampling method.

FIG. 1A illustrates an exemplary reception circuit. FIG. 1B illustrates an exemplary sampling method. A reception circuit illustrated in FIG. 1A may be an asynchronous type reception circuit. A reception circuit 100 illustrated in FIG. 1A includes an interpolation circuit 10, a calculation circuit 20, and a comparator 21. The interpolation circuit 10 generates interpolated data from input data Sin, using an interpolation coefficient k. By comparing the interpolated data with a reference value, the comparator 21 generates reception data. The calculation circuit 20 detects phase information from the reception data, and calculates a phase code (Interpolation Code) as the interpolation coefficient k. The phase information may be, for example, information relating to a phase difference between transmitted data and a sampling clock. As the calculation circuit 20, for example, a Clock Data Recovery (CDR) circuit may be used.

In FIG. 1B, a signal corresponding to a time is illustrated. In FIG. 1B, while a 2× method is used where two pieces of data are sampled in one unit interval, another method may also be used. Sn may correspond to input data input in chronological order. The interpolation circuit 10 generates one piece of interpolated data $D_n$ from two pieces of input data $S_{n-1}$ and $S_n$. When the interpolation coefficient k satisfies 0≤k≤1, the interpolated data $D_n$ is generated in accordance with $D_n=(1-k) \times S_{n-1}+k \times S_n$. Therefore, interpolated data matching the phase of the input data is generated. The interpolation coefficient k may be a coefficient weighting the input data.

Figure 2:
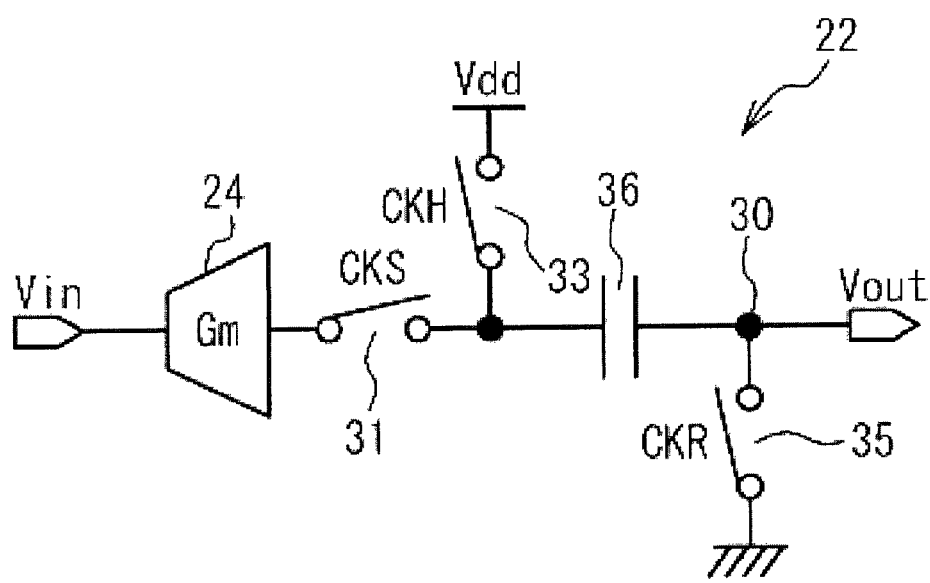
FIG. 2 illustrates an exemplary sampling circuit.

FIG. 2 illustrates an exemplary a sampling circuit. A sampling circuit illustrated in FIG. 2 may not perform an interpolation operation. As illustrated in FIG. 2, a sampling circuit 22 includes a gm circuit 24, switches 31, 33, and 35, and a variable capacitor 36. The gm circuit 24, the switch 31, and the variable capacitor 36 are electrically coupled in series between an input Vin and an output Vout. The input signal Vin is input to the gm circuit 24, and the input signal is subjected to voltage-to-current conversion. The switch 31 is electrically coupled between the output terminal of the gm circuit 24 and one end of the variable capacitor 36. The switch 33 is electrically coupled between one end of the variable capacitor 36 and a power source Vdd. The switch 35 is electrically coupled between the other end of the variable capacitor 36 and a ground. The other end of the variable capacitor 36 may be an output node 30. An output signal Vout is output from the output node 30. When clocks CKS, CKH, and CKR are at a high level, the switches 31, 33, and 35 are turned on, respectively, and when the clocks CKS, CKH, and CKR are at a low level, the switches 31, 33, and 35 are turned off, respectively.

FIG. 3A to FIG. 3D illustrate an exemplary sampling circuit. FIG. 3A to FIG. 3D may correspond to a reset state, a sampling state, a floating state, and a hold state, respectively. FIG. 4 illustrates an exemplary operation of a sampling circuit. In FIG. 4, one clock of data may correspond to one unit interval.

Figure 3A:
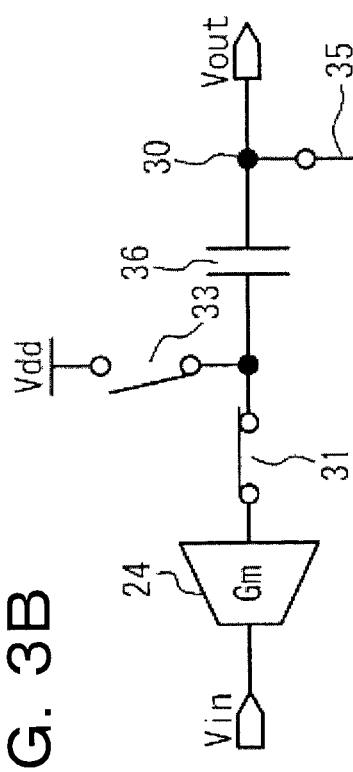
FIG. 3A to FIG. 3D illustrate an exemplary sampling circuit.

As illustrated in FIG. 3A and FIG. 4, between the time of t1 and the time of t2, the clock CKS is at a low level and the clocks CKH and CHR are at a high level. The switch 31 is turned off, and the switches 33 and 35 are turned on. The variable capacitor 36 is charged by a potential difference between the power source Vdd and the ground. Therefore, the sampling circuit 22 may enter the reset state.

Figure 3B:
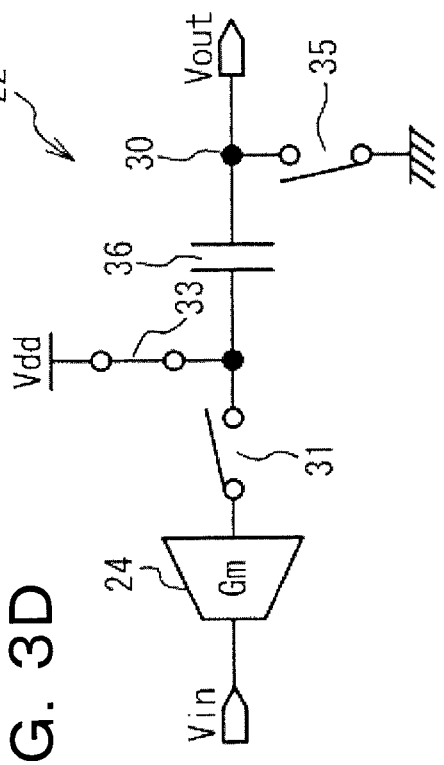

As illustrated in FIG. 3B and FIG. 4, between the time of t2 and the time of t6, the clocks CKS and CKR are at a high level and the clock CKH is at a low level. The switches 31 and 35 are turned on, and the switch 33 is turned off. The variable capacitor 36 is charged by a current output from the gm circuit 24. Therefore, the sampling circuit 22 may enter the sampling state.

Figure 3C:
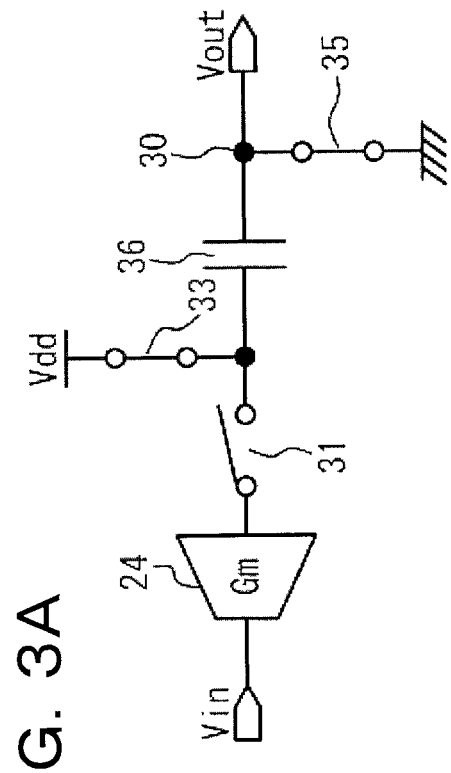

As illustrated in FIG. 3C and FIG. 4, between the time of t6 and the time of t7, the clocks CKS, CKH, and CKR are at a low level. The switches 31, 33, and 35 are turned off. Electric charge accumulated in the variable capacitor 36 is maintained. Therefore, the sampling circuit 22 may enter the floating state.

Figure 3D:
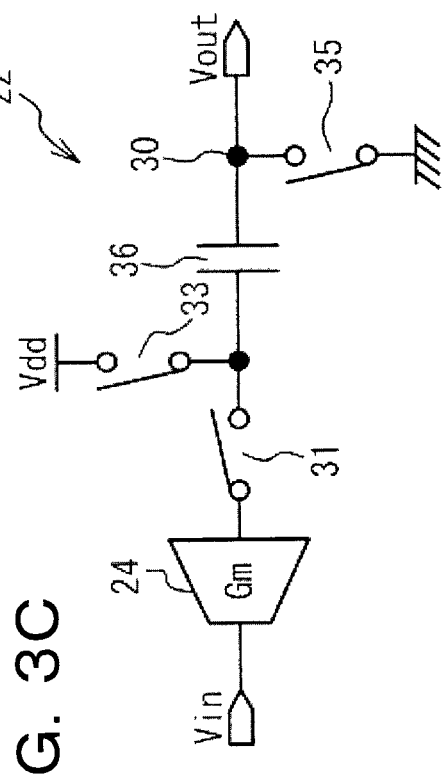

As illustrated in FIG. 3D and FIG. 4, between the time of t7 and the time of t1, the clock CKH becomes a high level, and the clocks CKS and CKR become a low level. The switch 33 is turned on, and the switches 31 and 35 are turned off. A voltage corresponding to the electric charge accumulated in the variable capacitor 36 is generated at the output node 30. Therefore, the sampling circuit 22 may enter the hold state.

Figure 5:
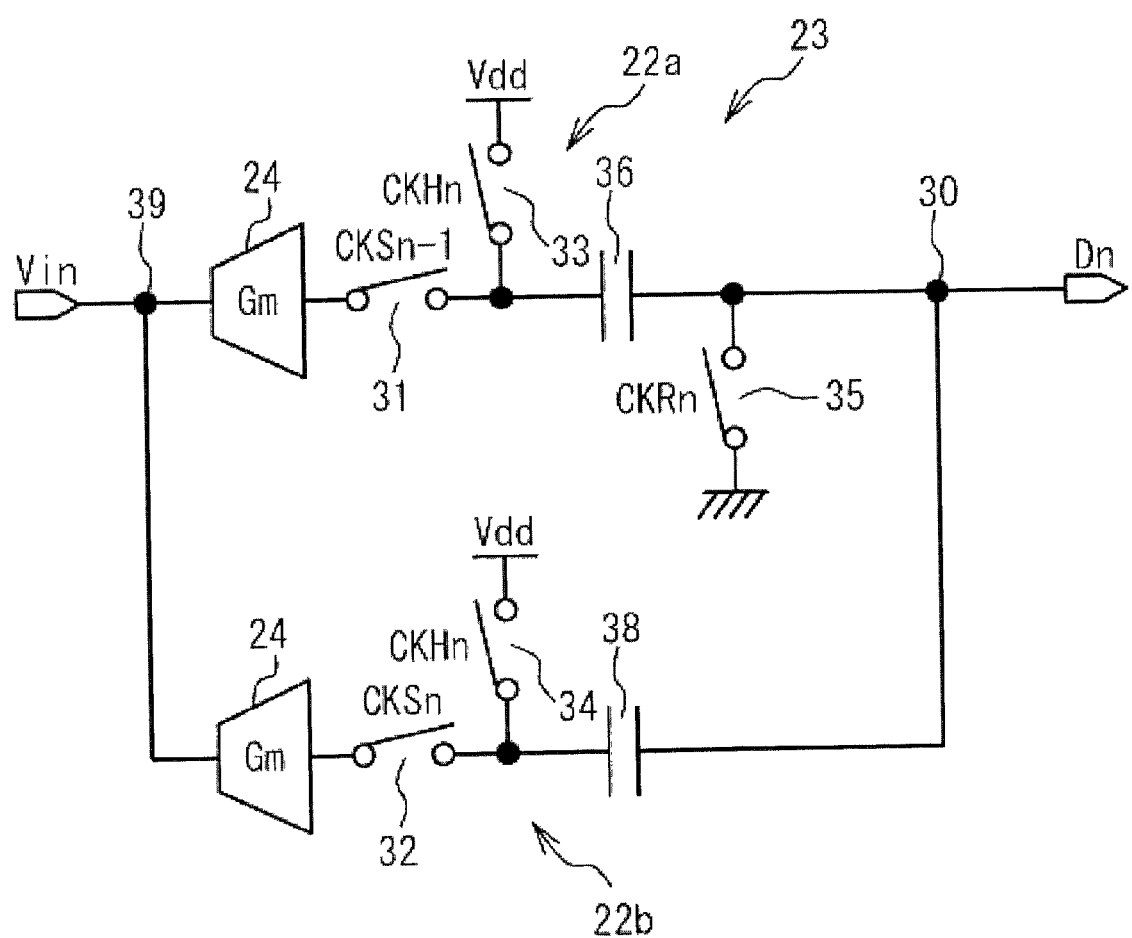
FIG. 5 illustrates an exemplary sampling circuit.

FIG. 5 illustrates an exemplary sampling circuit. A sampling circuit illustrated in FIG. 5 may perform an interpolation operation, and may be used for an interpolation circuit in an asynchronous-type reception circuit. In a sampling circuit 23 illustrated in FIG. 5, between an input node 39 and the output node 30, a sampling circuit 22a and a sampling circuit 22b are electrically coupled in parallel. The configuration of the sampling circuit 22a may be substantially the same as or similar to the configuration of the sampling circuit 22 illustrated in FIG. 2. In the sampling circuit 22b, between the input node 39 and the output node 30, the gm circuit 24, a switch 32, and a variable capacitor 38 are electrically coupled in series. Between the power source Vdd and a node between the variable capacitor 38 and the switch 32, the switch 34 is electrically coupled. The interpolated data Dn is output from the output node 30. When clocks CKSn−1, CKSn, CKHn, CKHn, and CKRn are at a high level, the switches 31, 32, 33, 34, and 35 are turned on, respectively, and when the clocks CKSn−1, CKSn, CKHn, CKHn, and CKRn are at a low level, the switches 31, 32, 33, 34, and 35 are turned off, respectively. In FIG. 5, the other configuration may be substantially the same as or similar to the configuration illustrated in FIG. 2.

Figure 6:
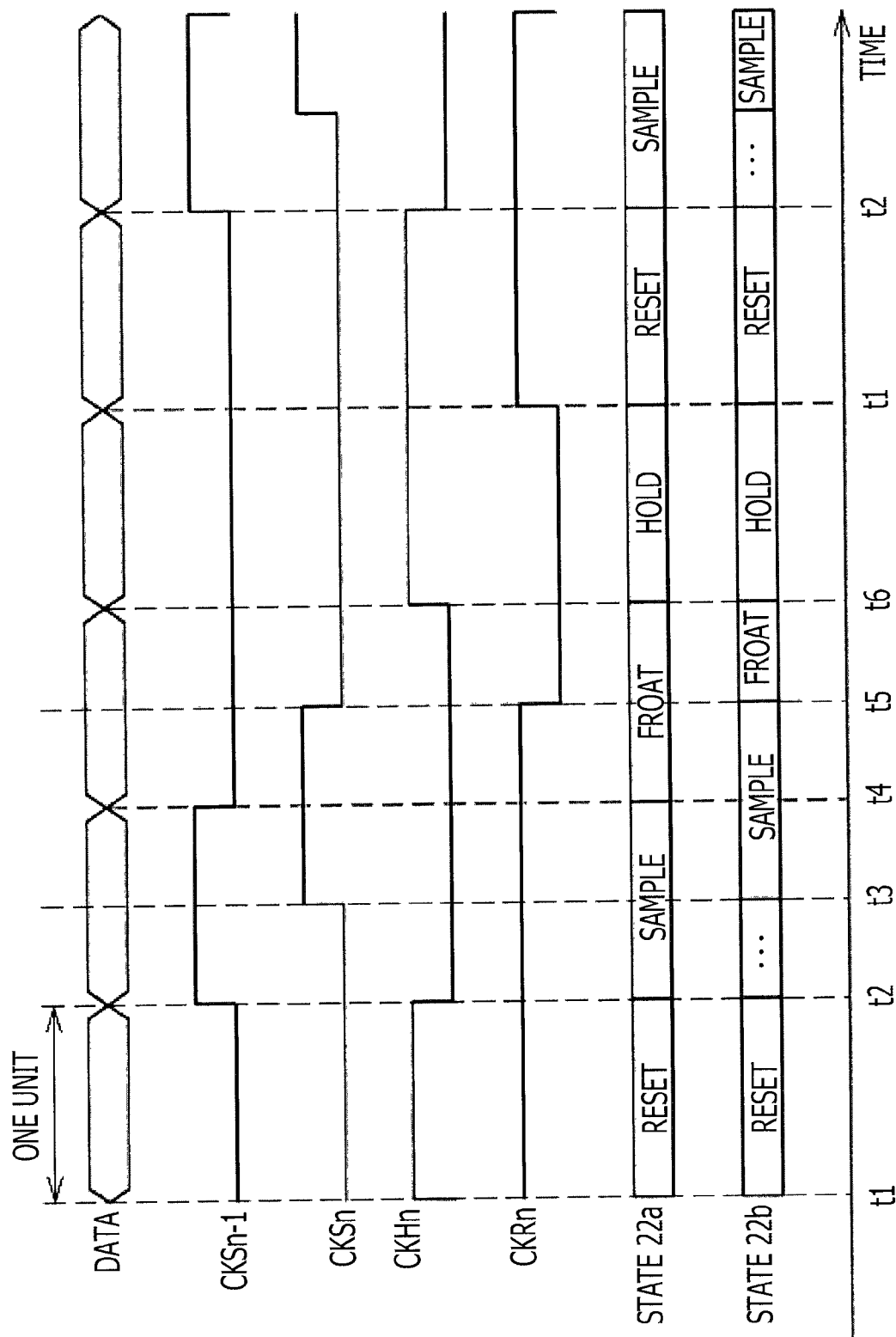
FIG. 6 illustrates an exemplary sampling circuit.

FIG. 6 illustrates an exemplary sampling circuit. FIG. 6 may illustrate the timing chart of the sampling circuit illustrated in FIG. 5. Between the time of t1 to the time of t2, the clocks CKHn and CKRn are at a high level and the clocks CKSn−1 and CKSn are at a low level. The switches 33, 34, and 35 are turned on, and the switches 31 and 32 are turned off. Therefore, both of the sampling circuits 22a and 22b may be in the reset states.

At the time of t2, the clock CKSn−1 becomes a high level, and the clock CKHn becomes a low level. The switch 31 is turned on, and the switches 33 and 34 are turned off. Therefore, the sampling circuit 22a may enter the sampling state. At the time of t3, the clock CKSn becomes a high level, and the switch 32 is turned on. Therefore, the sampling circuits 22a and 22b may enter the sampling states.

Since, at the time of t4, the clock CKSn−1 becomes a low level, the switch 31 is turned off. Therefore, the sampling circuit 22a maintains the floating state, and the sampling circuit 22b maintains the sampling state. At the time of t5, the clocks CKSn and CKRn become a low level. The switches 32 and 35 are turned off. Therefore, the switches 31 to 35 are turned off. The sampling circuits 22a and 22b enter a floating state.

Since, at the time of t6, the clock CKHn becomes a high level, the switches 33 and 34 are turned on. Therefore, the electric charge of the variable capacitors 36 and 38 is combined, and the interpolated data Dn is generated at the output node. Since, at the time of t1, the clock CKRn is turned on, the switch 35 is turned on. Therefore, the sampling circuits 22a and 22b enter a reset state.

In the sampling circuit 22a, electric charge corresponding to an input signal between the time of t2 and the time of t4 is accumulated in the variable capacitor 36. In the sampling circuit 22b, electric charge corresponding to an input signal between the time of t3 and the time of t5 is accumulated in the variable capacitor 38. Between the time of t6 and the time of t1, at the output node 30, interpolated data corresponding to a voltage obtained by combining the electric charge accumulated in the variable capacitor 36 and the electric charge accumulated the variable capacitor 38 is generated. For example, a time period between the time of t2 and the time of t4 may be a time period corresponding to the input data Sn−1, and a time period between the time of t3 and the time of t5 may be a time period corresponding to the input data Sn. A ratio between the capacitance values of the variable capacitors 36 and 38 may be 1−k:k. Therefore, as the interpolated data Dn, Dn=(1−k)×Sn−1+k×Sn is generated.

Figure 7:
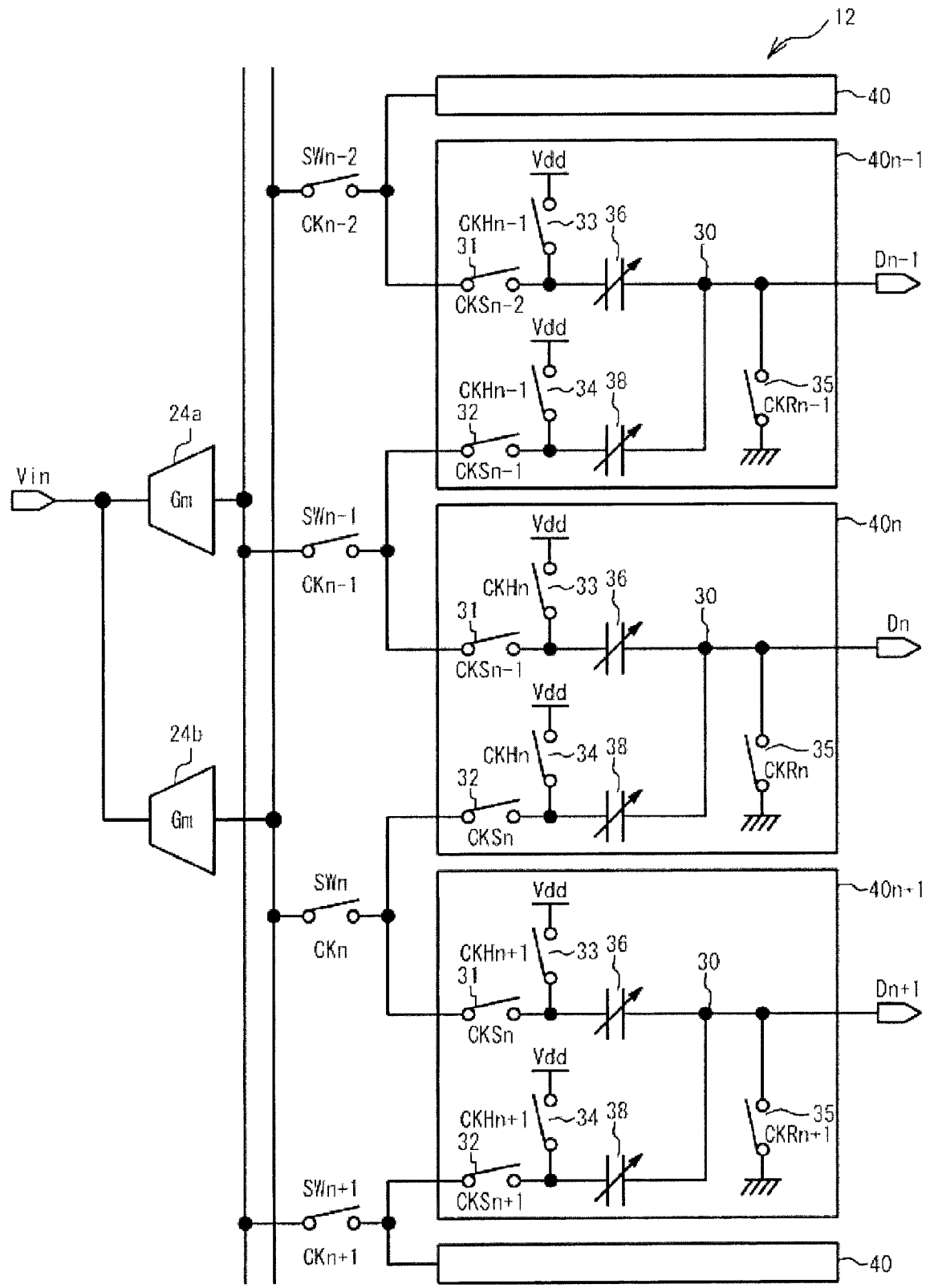
FIG. 7 illustrates an exemplary interpolation circuit.

FIG. 7 illustrates an exemplary interpolation circuit. An interpolation circuit illustrated in FIG. 7 may generate a plurality of pieces of interpolated data. An interpolation circuit 12 includes gm circuits 24a and 24b and a plurality of capacitor circuits 40. Each capacitor circuit 40 may be substantially the same as or similar to the sampling circuit 23 illustrated in FIG. 6. A switch 31 in the capacitor circuit 40n is coupled to the output node of the gm circuit 24a through a switch SWn−1. The switch 32 in the capacitor circuit 40n is coupled to the output node of the gm circuit 24b through a switch SWn. When the clocks CKSn−1, CKSn, CKHn, CKHn, and CKRn are at a high level, the switches 31, 32, 33, 34, and 35 in the capacitor circuit 40n are turned on, respectively, and when the clocks CKSn−1, CKSn, CKHn, CKHn, and CKRn are at a low level, the switches 31, 32, 33, 34, and 35 in the capacitor circuit 40n are turned off, respectively. When the clock CKn is at a high level, the switch SWn is turned on, and when the clock CKn is at a low level, the switch SWn is turned off.

Figure 8:
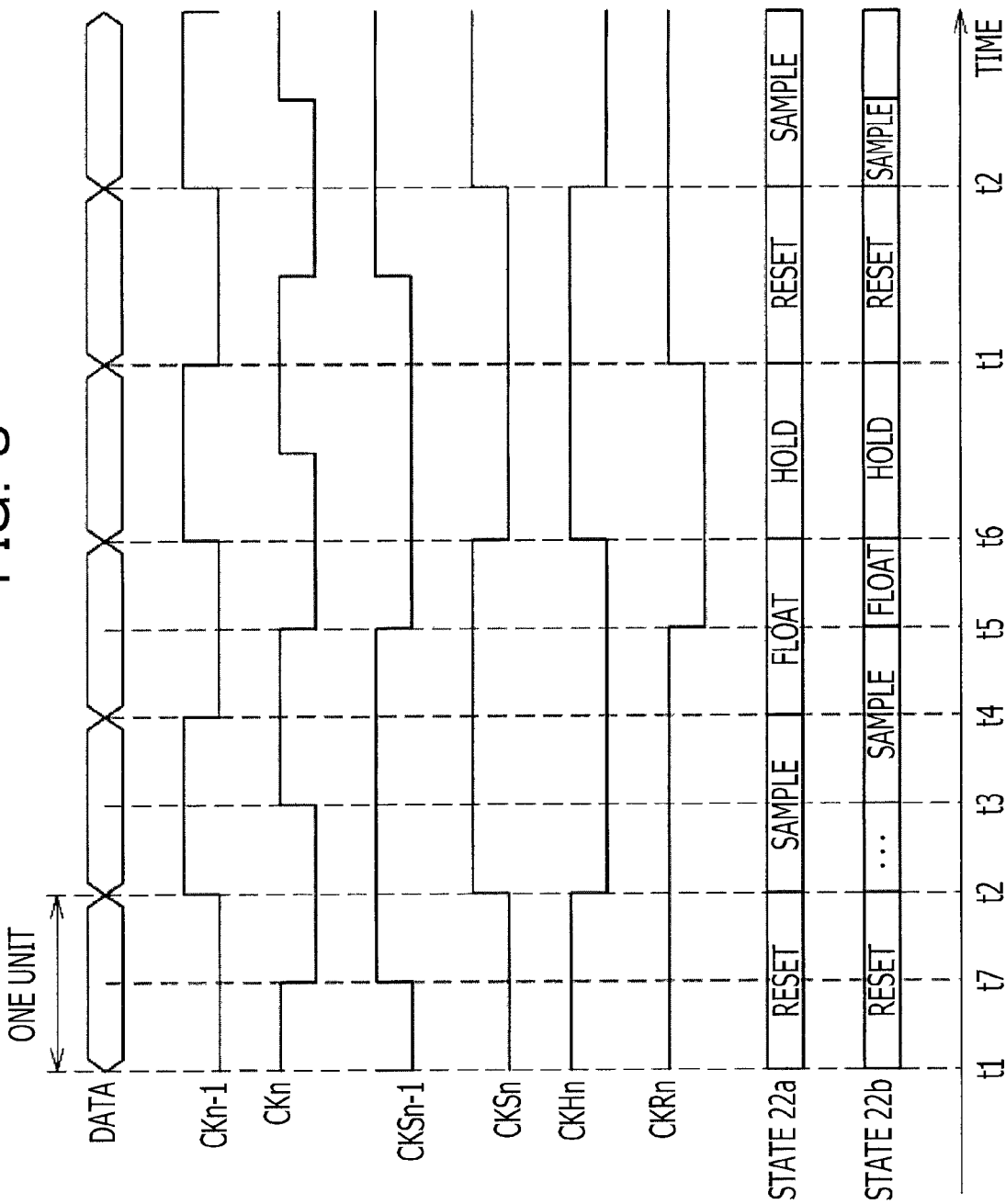
FIG. 8 illustrates an exemplary operation of a capacitor circuit.

FIG. 8 illustrates an exemplary operation of a capacitor circuit. In FIG. 8, the timing chart of the capacitor circuit 40n in the interpolation circuit illustrated in FIG. 7 may be illustrated. Between the time of t1 and the time of t7, the clocks CKn, CKHn, and CKRn are at a high level, and the clocks CKn−1, CKSn−1, and CKSn are at a low level. The switches SWn, 33, 34, and 35 are turned on, and the switches SWn−1, 31, and 32 are turned off. Therefore, both of the sampling circuits 22a and 22b in the capacitor circuit 40n may be in reset states. At the time of t7, the clock CKn becomes a low level and the clock CKSn becomes a high level. The switch SWn is turned off, and the switch 31 is turned on. Since the switch SWn−1 is turned off and the switches 33 and 34 are turned on, the sampling circuits 22a and 22b may be in reset states.

At the time of t2, the clocks CKn−1 and CKn become a high level and the clock CKHn becomes a low level. The switches SWn−1 and 32 are turned on, and the switches 33 and 34 are turned off. Therefore, the sampling circuit 22a may enter the sampling state. At the time of t3, the clock CKn becomes a high level and the switch SWn is turned on. Therefore, both of the sampling circuits 22a and 22b may enter a sampling state.

At the time of t4, since the clock CKn−1 becomes a low level, the switch SWn−1 is turned off. The sampling circuit 22a may enter the floating state. The sampling circuit 22b maintains the sampling state. At the time of t5, the clocks CKn, CKSn−1, and CKRn become a low level. The switches SWn, 31, and 35 are turned off. Therefore, the sampling circuits 22a and 22b may enter a floating state.

At the time of t6, the clocks CKn−1 and CKHn become a high level and the clock CKSn becomes a low level. The switches 33 and 34 are turned on, and the switch 32 is turned off. Therefore, the electric charge of the variable capacitor 36 and the electric charge of the variable capacitor 38 are combined, and the interpolated data Dn is generated at the output node.

In the interpolation circuit 12 illustrated in FIG. 7, electric charge corresponding to a input signal in a time period when the switch SWn−1 and the switch 31 in the capacitor circuit 40n are turned on, for example, a time period between the time of t2 and the time of t4, is accumulated in the variable capacitor 36. Electric charge corresponding to an input signal in a time period when the switch SWn and the switch 32 in the capacitor circuit 40n are turned on, for example, a time period between the time of t3 and the time of t5, is accumulated in the variable capacitor 38. Between the time of t6 and the time of t1, the interpolated data Dn corresponding to a voltage obtained by combining the electric charge accumulated in the variable capacitor 36 and the electric charge accumulated in the variable capacitor 38 is generated at the output node 30 of the capacitor circuit 40n.

In FIG. 7, the sum of the capacitance values of the variable capacitor 38 in the capacitor circuit 40n and the variable capacitor 36 in the capacitor circuit 40n+1, the capacitor circuit 40n and the capacitor circuit 40n+1 being coupled to the switch SWn (the n is a natural number of from 1 to N), may be substantially fixed independently of the n. When the capacitance value coupled to the switch SWn is different, even if substantially the same current flows, a voltage generated at the output node 30 may become different. Therefore, interpolated data may become incorrect.

Figure 9:
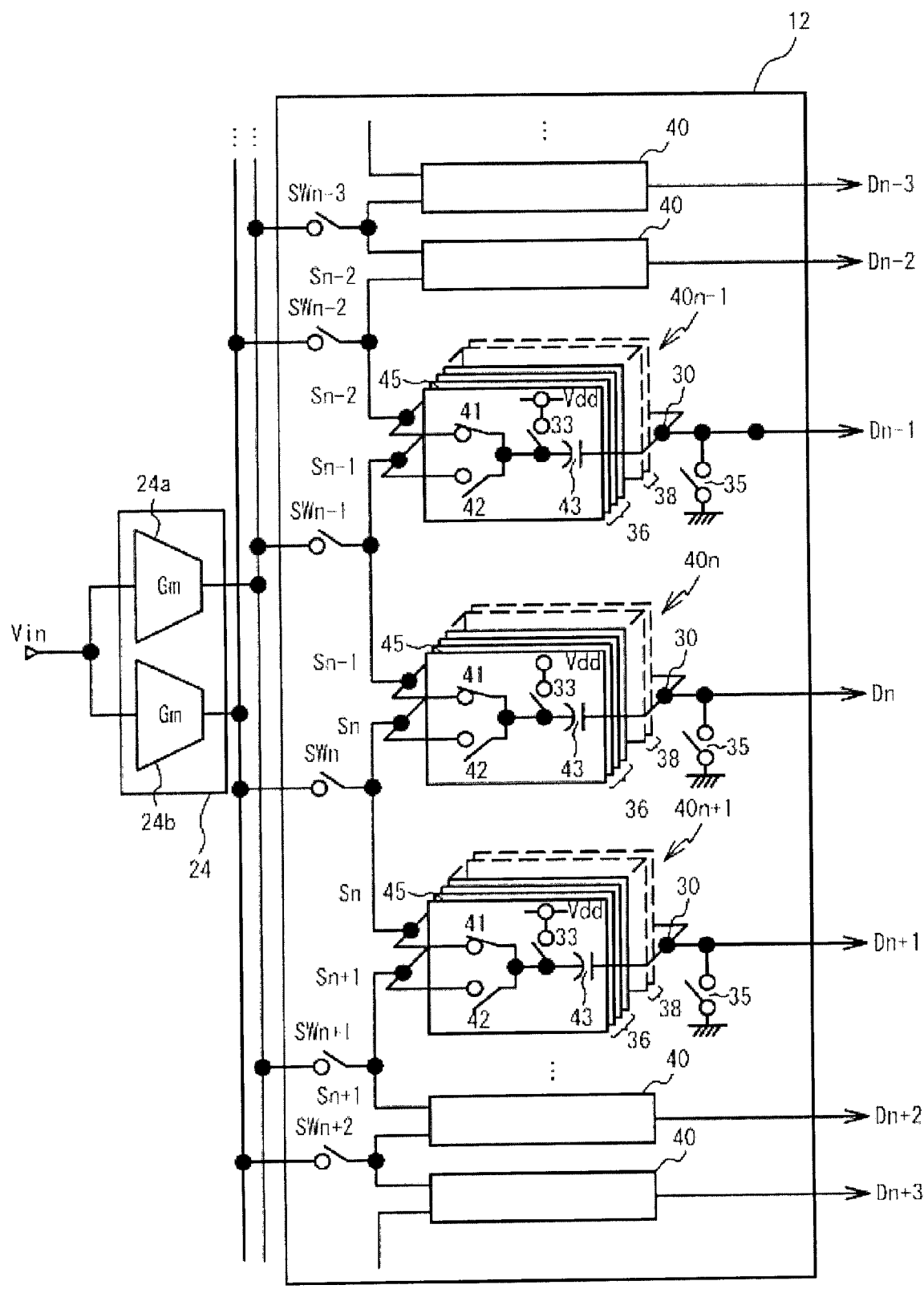
FIG. 9 illustrates an exemplary interpolation circuit.

FIG. 9 illustrates an exemplary interpolation circuit. In the interpolation circuit illustrated in FIG. 9, the sum of the capacitance values of the variable capacitor 38 and variable capacitor 36 coupled to the switch SWn may become constant independently of the n. An interpolation circuit 12 includes a gm circuit 24 and a plurality of capacitor circuits 40. The gm circuit 24 includes gm circuits 24a and 24b. The interpolation circuit 12 includes the plural capacitor circuits 40, for example, the capacitor circuits 40 whose number is N. The capacitor circuit 40 includes a plurality of slices 45, for example, the slices 45 whose number is Nc. Each slice 45 includes switches 33, 41, and 42 and a capacitor 43. The switch 41 is coupled between the switch SWn−1 (the n is a natural number of from 1 to N) and one end of the capacitor 43. The switch 42 is coupled between the switch SWn and one end of the capacitor 43. The other end of the capacitor 43 is coupled to the output node 30. The switch 33 may be substantially the same as or similar to the switch 33 illustrated in FIG. 6, and is coupled between one end of the capacitor 43 and the power source Vcc. Since the switch 33 is provided in each slice 45, every capacitor 43 may be charged.

The slices 45 whose number is Nc are coupled in parallel. The capacitance values of the capacitors 43 in the slices 45 whose number is Nc may be substantially equal to one another. The switches 41 and 42 may be turned on or off in a mutually complementary manner. For example, when the switch 41 is turned on, the switch 42 may be turned off, and when the switch 41 is turned off, the switch 42 may be turned on. Therefore, the capacitors 43 in the slices 45 where the switches 41 are turned on may be coupled in parallel to the switch SWn−1, and the capacitors 43 in the slices 45 may correspond to the variable capacitor 36. The capacitors 43 in the slices 45 where the switches 42 are turned on may be coupled in parallel to the switch SWn, and the capacitors 43 in the slices 45 may correspond to the variable capacitor 38. The sum of the capacitance values of the variable capacitor 36 and the variable capacitor 38 may be substantially the same. A kn may range from 0 to Nc, kn=0 may be satisfied when k=0 is satisfied, and kn=Nc may be satisfied when k=1 is satisfied. For example, kn=k×Nc may be satisfied. From among the slices 45 whose number is Nc, the switches 41 in the slices 45 whose number is (Nc−kn) may be turned on, and the switches 42 whose number is kn may be turned on. Therefore, the interpolated data Dn proportional to (Nc−kn)/Nc×Sn−1+kn/Nc×Sn is output to the output node 30. In FIG. 9, solid lines indicate the slices 45 included in the variable capacitor 36, and dashed lines indicate the slices 45 included in the variable capacitor 38. The same may apply to the following drawings.

Figure 10:
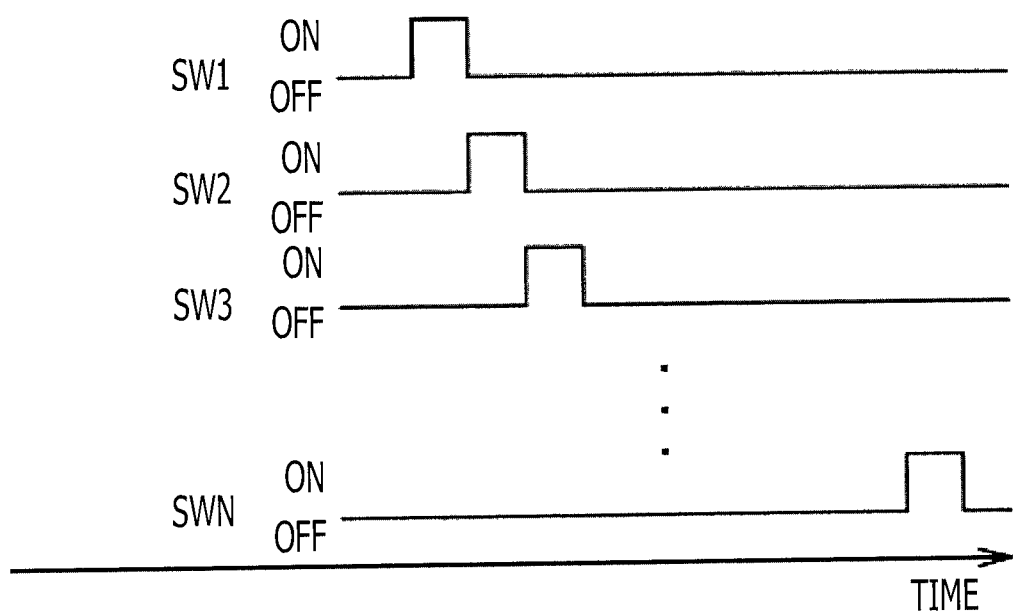
FIG. 10 illustrates an exemplary switch operation.

FIG. 10 illustrates an exemplary operation of a switch. In FIG. 10, the timing charts of the switches SW1 to SWN illustrated in FIG. 9 may be illustrated. The switches SW1 to SWN may be turned on at a timing corresponding to pieces of data S1 to SN in a chronological order, for exemplary, data S1 to SN that are sequentially input in chronological order. Therefore, pieces of interpolated data D1 to DN may be generated in chronological order, for example, so as to correspond to the same time ordering of the pieces of the data S1 to SN).

Figure 11A:
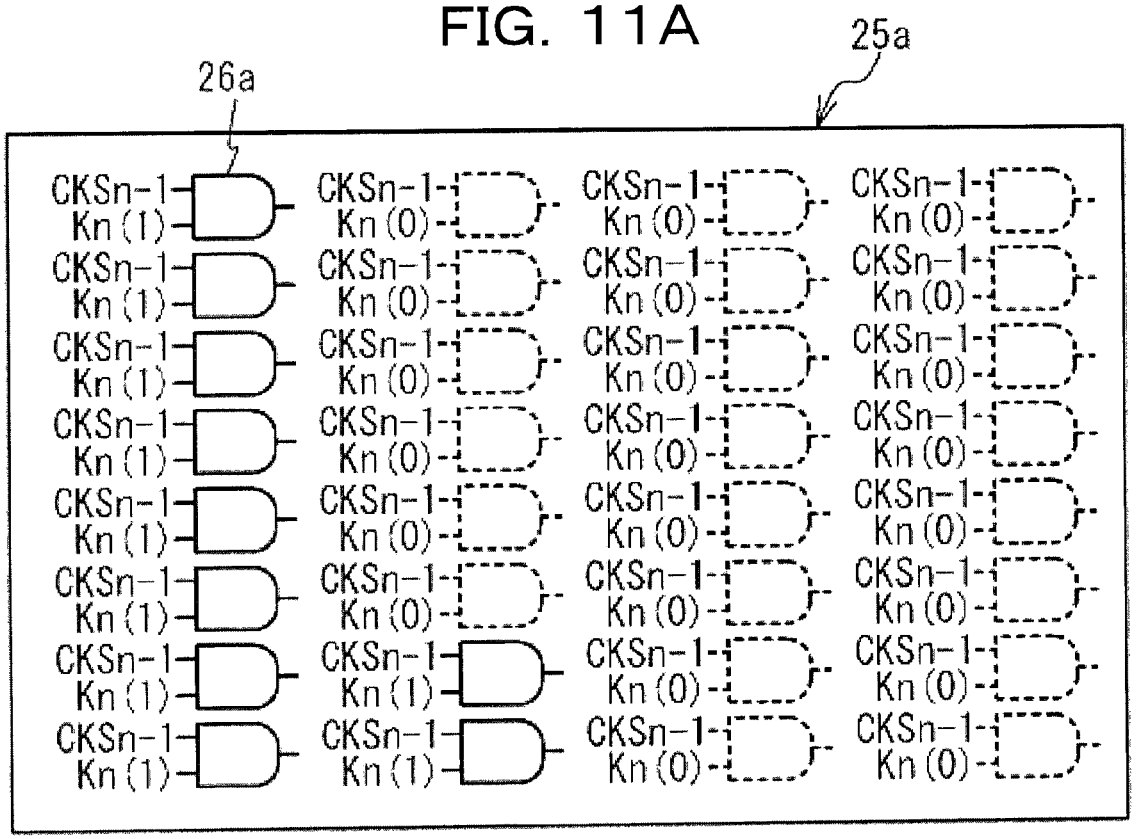
FIG. 11A and FIG. 11B illustrate an exemplary logic circuit.
Figure 11B:
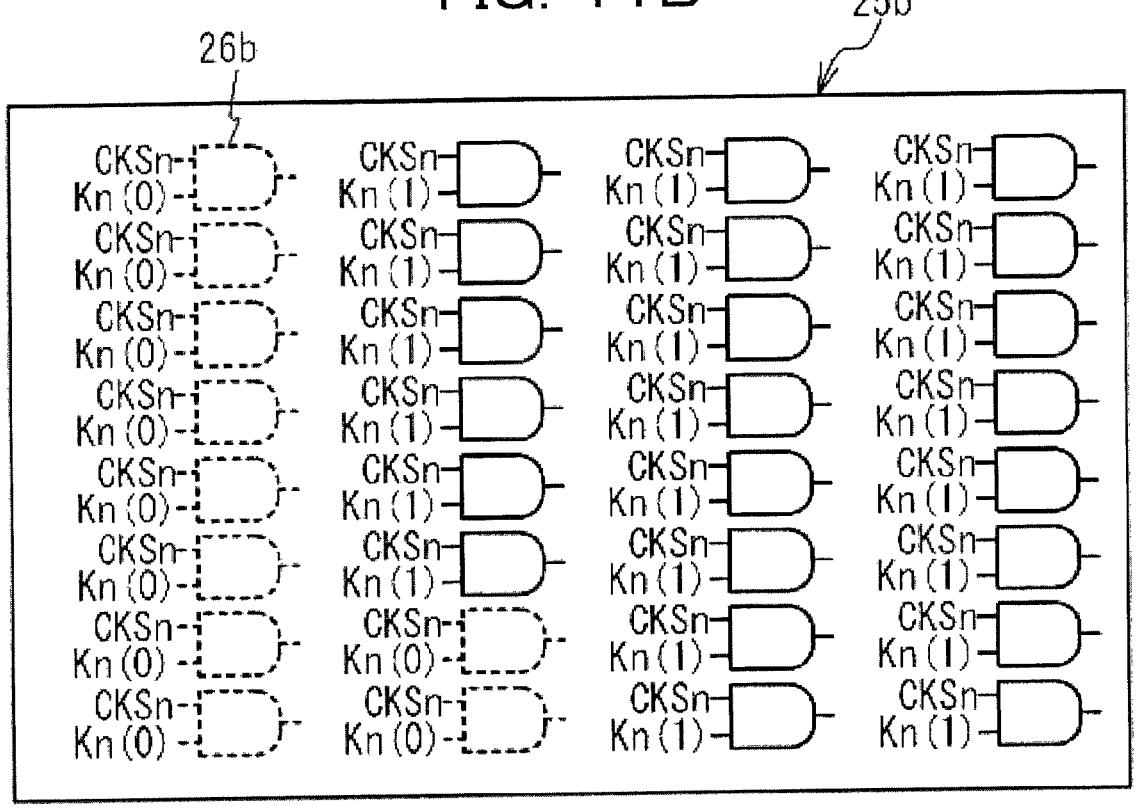

FIG. 11A and FIG. 11B illustrate an exemplary logic circuit. As illustrated in FIG. 11A, a logic circuit 25a may include AND circuits 26a whose number is Nc, for example, 32. The individual AND circuits 26a are coupled to the switches 41 in the individual slices 45 in the capacitor circuit 40n. The clock CKSn−1 and a control code kn are input to the AND circuit 26a. The control code kn may be a code indicating whether the switch 41 in each slice 45 is to be turned or turned off. When the control code kn is 1 (illustrated as kn(1)) and the clock CKSn−1 is at a high level, the corresponding switch 41 may be turned on. When the control code kn is 0 (illustrated as kn(0)), even if the clock CKSn−1 is at a high level, the corresponding switch 41 is turned off. The control code kn may be a signal indicating that the capacitor 43 is to be connected to which between a node Nn−1 and a node Nn. The clock CKSn−1 may be a signal corresponding to a timing when making the switches 41 and 42 turn on. In the capacitor circuits 40n−1 and 40n, the AND circuit 26a to which the interpolation code kn and the clock CKSn−1 are supplied is provided so as to correspond to the capacitor 43 in each slice 45. Based on the output of the AND circuit 26a, the switches 41 and 42 operate. In FIG. 11A, from among the AND circuits 26a whose number is 32, the control codes of the AND circuits 26a whose number is 10 may be 1 (solid lines in FIG. 11A, as the case may be), and the control codes of the AND circuits 26a whose number is 22 may be 0 (dotted lines in FIG. 11A, as the case may be). For example, from among the slices 45 whose number is 32, the switches 41 in the slices 45 whose number is 10 may be turned on, and the switches 41 in the slices 45 whose number is 22 may be turned off.

As illustrated in FIG. 11B, a logic circuit 25b includes AND circuits 26b whose number is Nc, for example, 32. The individual AND circuits 26b are coupled to the switches 42 in the individual slices 45 in the capacitor circuit 40n. The clock CKSn and the control code are supplied to the AND circuit 26b. In FIG. 11B, from among the AND circuits 26b whose number is 32, the control codes kn of the AND circuits 26b whose number is 22 may be 1, and the control codes kn of the AND circuits 26b whose number is 10 may be 0. For example, from among the slices 45 whose number is 32, the switches 42 in the slices 45 whose number is 22 may be turned on, and the switches 42 in the slices 45 whose number is 10 may be turned off.

From among the capacitors 43 in the slices 45 in the capacitor circuit 40n illustrated in FIG. 9, the capacitors 43 whose number is 10 may be coupled to the switch SWn−1, and the capacitors 43 whose number is 22 may be coupled to the switch SWn.

In the interpolation circuit illustrated in FIG. 9, interpolated data is generated based on an input signal. In each capacitor circuit 40, the slices 45 may be provided whose number corresponds to the accuracy of interpolation. In each capacitor circuit 40, the AND circuits 26 may be provided whose number is twice the number of the slices 45.

Figure 12:
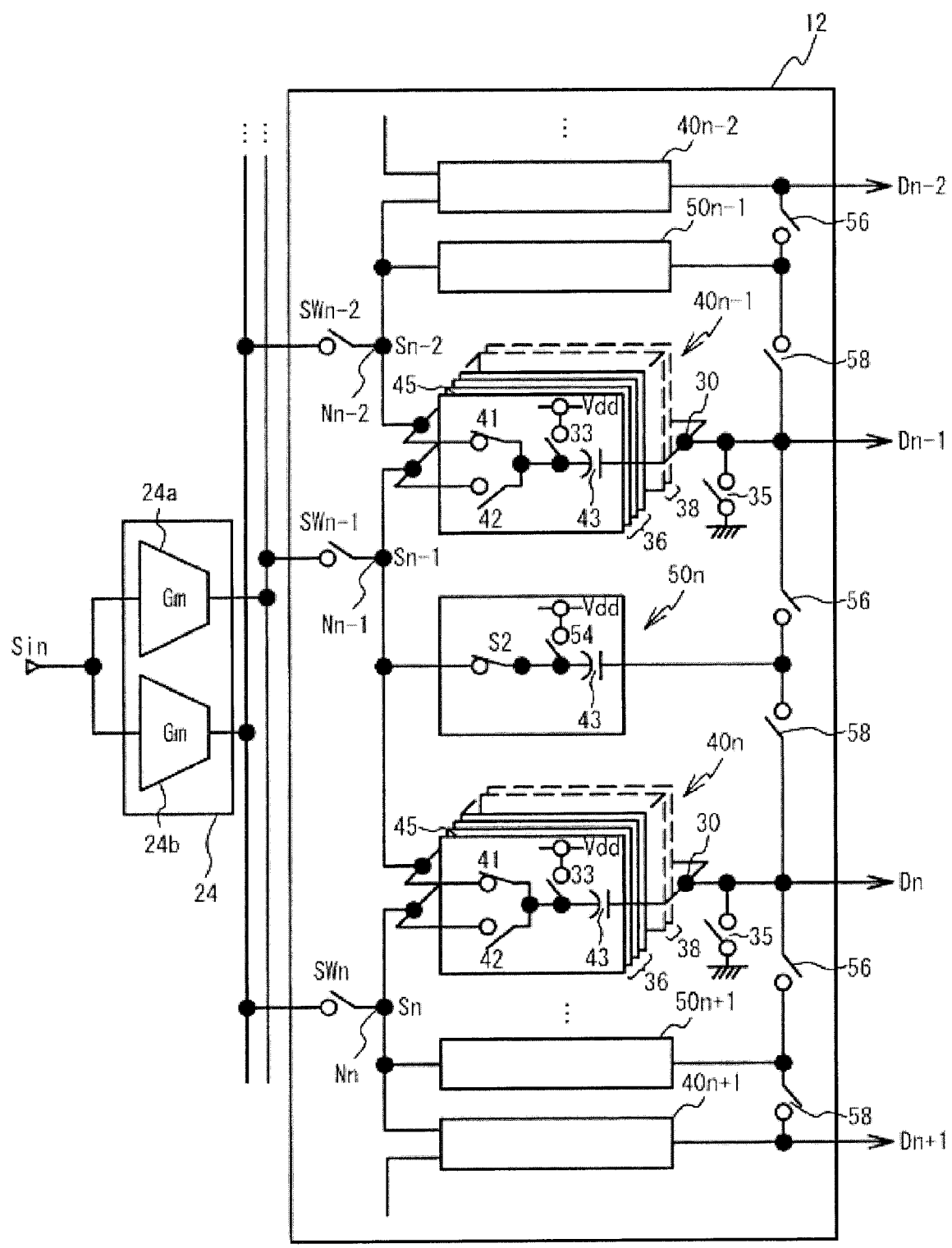
FIG. 12 illustrates an exemplary interpolation circuit.

FIG. 12 illustrates an exemplary interpolation circuit. The switches SWn−2 and SWn−1 and the switch SWn are coupled to the node Nn−2, the Nn−1, and the Nn, for example, the node 1, the node 2, and the node 3, respectively. Currents corresponding to the pieces of the input data Sn−2 to Sn which are input in chronological order are applied to the nodes Nn−2 to Nn. The capacitor circuit 40n−1, for example, a first capacitor circuit, includes the plural capacitors 43, for example, first capacitors, the switches 41, 42, 33, and 35, and the output node 30. The switches 41 and 42, for example, first switches, selectively coupled ends of a portion of the plural capacitors 43 to the node Nn−2, and selectively coupled ends of the remaining capacitors 43 from among the plural capacitors 43 to the node Nn−1. The other end of each of the plural capacitors 43 is coupled to the output node 30, for example, a first output node. The switch 33 is coupled between one end of the capacitor 43 and the power source Vdd. The switch 35 is coupled between the output node 30 and the ground.

The capacitor circuit 40n, for example, a second capacitor circuit, includes the plural capacitors 43, for example, second capacitors, the switches 41 and 42, for example, second switches, and the output node 30, for example, a second output node. The switches 41 and 42 selectively couple ends of a portion of the capacitors 43 to the node Nn−1, and selectively coupled ends of the remaining capacitors 43 from among the plural capacitors 43 to the node Nn. The other end of each of the plural capacitors 43 is coupled to the output node 30, for example, a second output node.

A capacitor circuit 50n, for example, a third capacitor circuit, includes the capacitor 43, for example, a third capacitor, and switches 52, 54, 56, and 58. The switch 52 couples one end of the capacitor 43 to the node Nn−1. The switches 56 and 58 couple another end of the capacitor 43 to one of the output node 30 of the capacitor circuit 40n−1 and the output node 30 of the capacitor circuit 40n. The switch 54 couples the power source Vdd to one end of the capacitor 43. In the same way as the switch 53, the switch 54 may be used for resetting the capacitor 43.

The number of the slices 45 in each of the capacitor circuits 40n−1 and 40n may be, for example, 16. The capacitance value of the capacitor 43 in the capacitor circuit 50n may be sixteen times as large as that of each capacitor 43 in the capacitor circuits 40n−1 and 40n.

FIG. 13A to FIG. 13D illustrate an exemplary logic circuit. A logic circuit 25a illustrated in FIG. 13A includes AND circuits 26a whose number is Nc/2, for example, 16. The individual AND circuits 26a are coupled to the switches 41 in the individual slices 45 in the capacitor circuit 40n−2. The clock CKSn−2 and the control code kn are input to the AND circuit 26a. When the control code kn is 1 and the clock CKSn−2 is at a high level, the corresponding switch 41 is turned on. When the control code kn is 0, the corresponding switch 41 is turned off even if the clock CKSn−2 is at a high level. From among the AND circuits 26a whose number is 16, the control codes of the AND circuits 26a whose number is 10 may be 1, and the control codes of the AND circuits 26a whose number is 6 may be 0. For example, from among the slices 45 whose number is 16, the switches 41 in the slices 45 whose number is 10 are turned on, and the switches 41 in the slices 45 whose number is 6 are turned off.

Figure 13A:
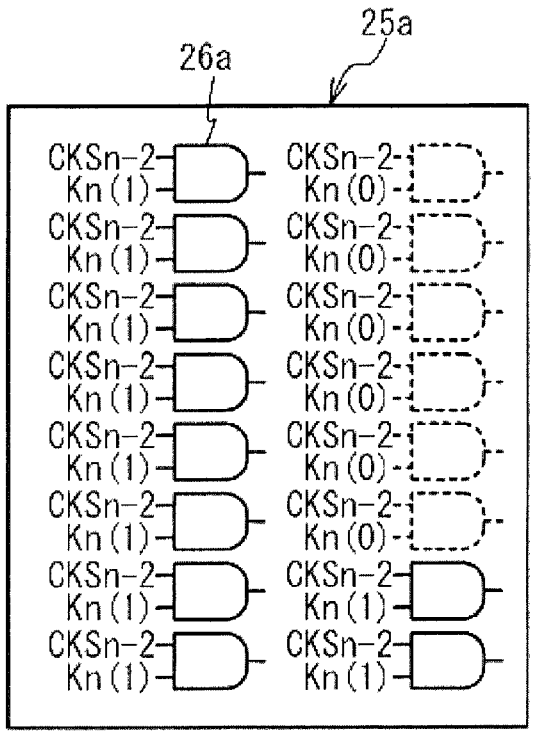
FIG. 13A to FIG. 13D illustrate an exemplary logic circuit.
Figure 13B:
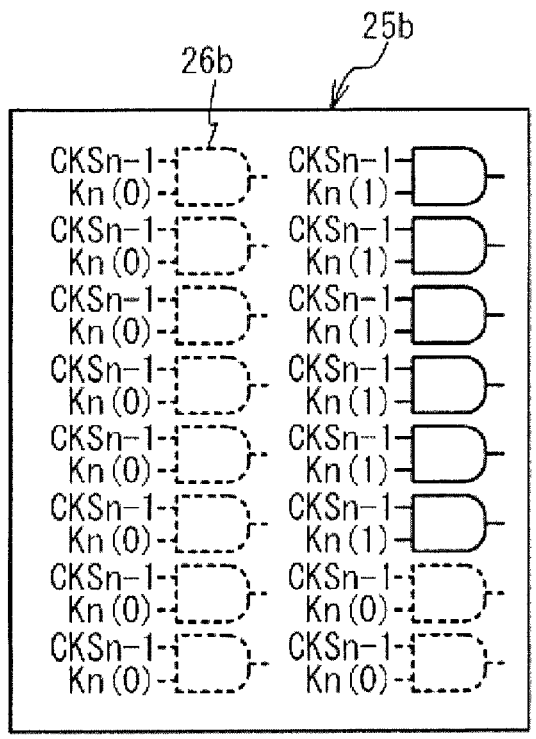

A logic circuit 25b illustrated in FIG. 13B includes AND circuits 26b whose number is Nc, for example, 16. The individual AND circuits 26b are coupled to the switches 42 in the individual slices 45 in the capacitor circuit 40n−1. The clock CKSn−1 and the control code kn are input to the AND circuit 26b. In FIG. 13B, from among the AND circuits 26b whose number is 16, the control codes of the AND circuits 26b whose number is 6 may be 1, and the control codes of the AND circuits 26b whose number is 10 may be 0.

Figure 13C:
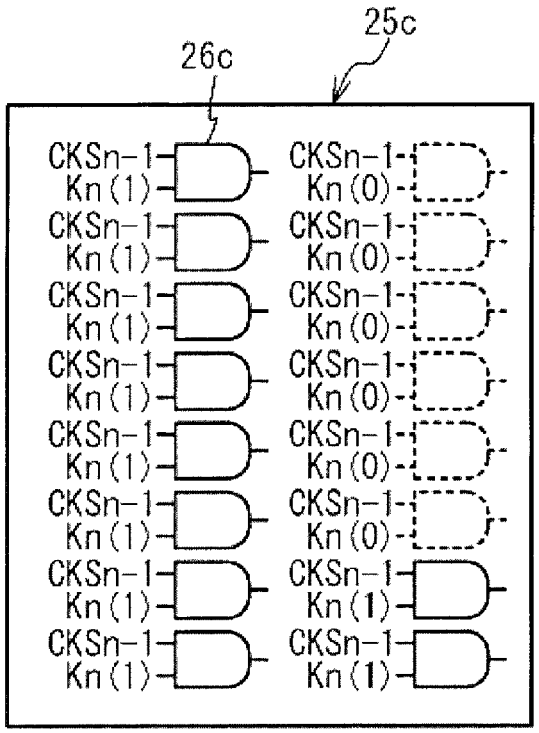

A logic circuit 25c illustrated in FIG. 13C includes AND circuits 26c whose number is Nc, for example, 16. The individual AND circuits 26c are coupled to the switches 41 in the individual slices 45 in the capacitor circuit 40n. A logic circuit 25d illustrated in FIG. 13D includes AND circuits 26d whose number is Nc, for example, 16. The individual AND circuits 26d are coupled to the switches 42 in the individual slices 45 in the capacitor circuit 40n. The turn-on and turn-off of the switches 41 and 42 in the capacitor circuit 40n may be substantially the same as or similar to the turn-on and turn-off of the capacitor circuit 40n−1.

When the clock CKn−1 is at a high level, the switch 52 in the capacitor circuit 50n is turned on, and when the clock CKn−1 is at a low level, the switch 52 in the capacitor circuit 50n is turned off. When at least the clock CKn−1 is at a high level, the switch 56 is turned on and the switch 58 is turned off. Therefore, the capacitor 43 in the capacitor circuit 50 is coupled between the node Nn−1 and the output node 30 of the capacitor circuit 40n−1.

In the same way, in the capacitor circuits 50n−1 and 50n+1, the switch 56 is also turned on and the switch 58 is also turned off. Therefore, the capacitors 43 coupled between the node Nn−1 and the output node 30 of the capacitor circuit 40n may correspond to the capacitors 43 in the capacitor circuit 40n, whose number is 10. The capacitors 43 coupled between the node Nn and the output node 30 of the capacitor circuit 40n may correspond to the capacitors 43 in the capacitor circuit 40n, whose number is 6, and the capacitor 43 in the capacitor circuit 50n, and may be equivalent to the capacitors 43 in the capacitor circuit 40n, whose number is 22. Therefore, in the same way as in FIG. 11A and FIG. 11B, interpolation may be performed with substantially the same resolving power as when the number of the slices 45 is 32. Each of the number of the AND circuits 26a to the number of the AND circuits 26d may become half the number of the AND circuits illustrated in FIG. 11A and FIG. 11B. The circuit size of the interpolation circuit may be reduced.

Figure 13D:
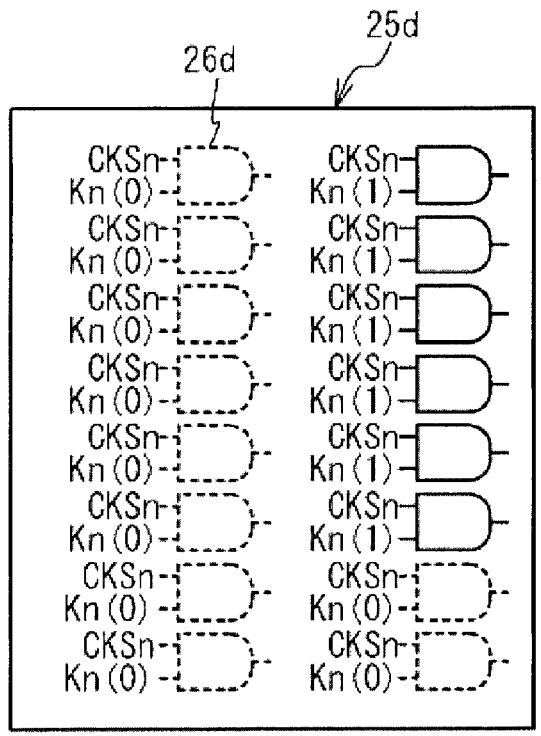

In FIG. 12 to FIG. 13D, the capacitance value of the capacitor coupled to the node Nn is set to a capacitance value larger than the node Nn−1. In a case where the capacitance value coupled to the node Nn−1 becomes larger than the node Nn, when at least the clock CKn−1 is at a high level, the switch 56 may be turned off and the switch 58 may be turned on. The switch 56 and the switch 58 are turned on or turned off based on an interpolation coefficient. The switches 56 and 58 may be subjected to switching with a frequency low enough for the interpolation coefficient to be changed. Therefore, as compared with the switches 41 and 42, the frequency of the switching may be reduced. Power consumption due to the switching may be reduced.

The switches 41 and 42 in the capacitor circuit 40n−1 couple one end of each of the capacitors 43 to one of the node Nn−2 and the node Nn−1 in a complementary manner. The switches 41 and 42 in the capacitor circuit 40n couple one end of each of the capacitors 43 to one of the node Nn−1 and the node Nn in a complementary manner. The switches 56 and 58 in the capacitor circuit 50n couple one end of the capacitor 43 to one of the output node 30 of the capacitor circuit 40n−1 and the output node 30 of the capacitor circuit 40n. When the capacitor circuit 40 includes AND circuits, the number of the AND circuits may be reduced as illustrated in FIG. 13A to FIG. 13C. Therefore, the AND circuits, the wiring lines thereof, and the like are reduced, and hence, the circuit size of the interpolation circuit is reduced.

In the capacitor circuit 40n, based on the interpolation coefficient, the switches 41 and 42 couple one end of each of the plural capacitors 43 to one of the node Nn−1 and the node Nn. Based on the interpolation coefficient, the switches 56 and 58 couple the other end of the capacitor 43 in the capacitor circuit 50n to the output node 30 of the capacitor circuit 40n−1 or 40n. Therefore, based on the interpolation coefficient, the interpolated data is output from the output node 30.

The capacitance value of the capacitor 43 in the capacitor circuit 50n is larger than the capacitance value of the capacitor 43 in each slice 45 in the capacitor circuits 40n−1 and 40n. Therefore, the number of the AND circuits may be reduced. The capacitance value of the capacitor 43 in the capacitor circuit 50n may be sixteen times as large as the capacitance value of the capacitor 43 in each slice 45 in the capacitor circuits 40n−1 and 40n, and may also be another multiple thereof.

The capacitance values of the individual capacitors 43 in the individual slices 45 in the capacitor circuits 40n−1 and 40n may be substantially the same. Therefore, a capacitance value from each node Nn may become the same. The accuracy of the generated interpolated data may become high.

The number of the capacitors 43 in the capacitor circuit 50 may be one, and may also be plural.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An interpolation circuit comprising:
an input terminal;
a fourth switch configured to receive a first current corresponding to first input data from the input terminal, a second current corresponding to second input data from the input terminal and a third current corresponding to third input data from the input terminal;
a first node, coupled to the fourth switch, configured to receive the first current from the fourth switch;
a second node, coupled to the fourth switch, configured to receive the second current from the fourth switch;
a third node, coupled to the fourth switch, configured to receive the third current from the fourth switch;
a first capacitor circuit, the first capacitor circuit including:
a plurality of first capacitors;
a first switch configured to couple one end of each of the plurality of first capacitors to one of the first node and the second node; and
a first output coupled to the other end of each of the plurality of first capacitors;
a second capacitor circuit, the second capacitor including:
a plurality of second capacitors;
a second switch configured to couple one end of each of the plurality of second capacitors to one of the second node and the third node; and
a second output node coupled to the other end of each of the plurality of second capacitors; and
a third capacitor circuit, the third capacitor circuit including:
a third capacitor whose one end is coupled to the second node; and
a third switch configured to couple the other end of the third capacitor to one of the first output node and the second output node.

2. The interpolation circuit according to claim 1, wherein the first input data, the second input data and the third input data input to the input terminal in chronological order respectively, and the second node is coupled to the fourth switch directly.

3. The interpolation circuit according to claim 1, wherein the first switch couples one end of each of the plurality of first capacitors to one of the first node and the second node based on an interpolation coefficient.

4. The interpolation circuit according to claim 1, wherein the second switch couples one end of each of the plurality of second capacitors to one of the second node and the third node based on an interpolation coefficient.

5. The interpolation circuit according to claim 1, wherein the third switch couples one end of the third capacitor to one of the first output node and the second output node based on an interpolation coefficient.

6. The interpolation circuit according to claim 1, wherein a capacitance value of the third capacitor is larger than capacitance values of the plurality of first capacitors and capacitance values of the plurality of second capacitors.

7. The interpolation circuit according to claim 1, wherein capacitance values of the plurality of first capacitors and capacitance values of the plurality of second capacitors are equal to one another.

8. The interpolation circuit according to claim 1, wherein the first capacitor circuit includes a first logic circuit provided for each of the plurality of first capacitors.

9. The interpolation circuit according to claim 8, wherein the first logic circuit receives a signal indicating to which of the first node and the second node each of the plurality of first capacitors is to be coupled and a signal corresponding timing when the first switches are turned on.

10. The interpolation circuit according to claim 1, wherein the second capacitor circuit includes a second logic circuit provided for each of the plurality of second capacitors.

11. The interpolation circuit according to claim 10, wherein the second logic circuit receives a signal indicating to which of the second node and the third node each of the plurality of second capacitors is to be coupled and a signal corresponding timing when the second switches are turned on.

12. A reception system comprising:
an interpolation circuit; and
a calculation circuit configured to calculate an interpolation coefficient based on an output of the interpolation circuit,
wherein the interpolation circuit includes:
an input terminal;
a fourth switch configured to receive a first current corresponding to first input data from the input terminal, a second current corresponding to second input data from the input terminal and a third current corresponding to third input data from the input terminal;
a first node, coupled to the fourth switch, configured to receive the first current from the fourth switch;
a second node, coupled to the fourth switch, configured to receive the second current from the fourth switch;
a third node, coupled to the fourth switch, configured to receive the third current from the fourth switch;
a first capacitor circuit, the first capacitor circuit including:
  a plurality of first capacitors;
  a first switch configured to couple one end of each of the plurality of first capacitors to one of the first node and the second node; and
  a first output coupled to the other end of each of the plurality of first capacitors;
a second capacitor circuit, the second capacitor including:
  a plurality of second capacitors;
  a second switch configured to couple one end of each of the plurality of second capacitors to one of the second node and the third node; and
  a second output node coupled to the other end of each of the plurality of second capacitors; and
a third capacitor circuit, the third capacitor circuit including:
  a third capacitor whose one end is coupled to the second node; and
  a third switch configured to couple the other end of the third capacitor to one of the first output node and the second output node.

13. The reception system according to claim 12, wherein the first input data, the second input data and the third input data input to the input terminal in chronological order respectively, and the second node is coupled to the fourth switch directly.

14. The reception system according to claim 12, wherein the first switch couples one end of each of the plurality of first capacitors to one of the first node and the second node based on the interpolation coefficient.

15. The reception system according to claim 12, wherein the second switch couples one end of each of the plurality of second capacitors to one of the second node and the third node based on the interpolation coefficient.

16. The reception system according to claim 12, wherein the third switch couples one end of the third capacitor to one of the first output node and the second output node based on the interpolation coefficient.

17. The reception system according to claim 12, wherein a capacitance value of the third capacitor is larger than capacitance values of the plurality of first capacitors and capacitance values of the plurality of second capacitors.

18. The reception system according to claim 12, wherein capacitance values of the plurality of first capacitors and capacitance values of the plurality of second capacitors are equal to one another.

19. The reception system according to claim 12, wherein the first capacitor circuit includes a first logic circuit provided for each of the plurality of first capacitors.

20. The reception system according to claim 12, wherein the second capacitor circuit includes a second logic circuit provided for each of the plurality of second capacitors.

* * * * *